US009899273B1

United States Patent
Wang et al.

(10) Patent No.: US 9,899,273 B1
(45) Date of Patent: Feb. 20, 2018

(54) SEMICONDUCTOR STRUCTURE WITH DOPANTS DIFFUSE PROTECTION AND METHOD FOR FORMING THE SAME

(71) Applicant: Taiwan Semiconductor Manufacturing Co., Ltd., Hsinchu (TW)

(72) Inventors: Chun-Chieh Wang, Hsinchu (TW); Yi-Min Huang, Hsinchu (TW); Huai-Tei Yang, Hsinchu (TW); Shih-Chieh Chang, Hsinchu (TW); Zheng-Yang Pan, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/379,983

(22) Filed: Dec. 15, 2016

(51) Int. Cl.
*H01L 27/092* (2006.01)
*H01L 21/8238* (2006.01)
*H01L 21/265* (2006.01)

(52) U.S. Cl.
CPC .... *H01L 21/823892* (2013.01); *H01L 21/265* (2013.01); *H01L 21/82385* (2013.01); *H01L 21/823807* (2013.01); *H01L 21/823814* (2013.01); *H01L 21/823821* (2013.01); *H01L 27/0922* (2013.01); *H01L 27/0924* (2013.01); *H01L 27/0928* (2013.01)

(58) Field of Classification Search
CPC ........... H01L 21/823892; H01L 21/265; H01L 21/823807; H01L 21/823814; H01L 21/823821; H01L 21/82385; H01L 27/0922; H01L 27/0924; H01L 27/0928

USPC ........................................................ 257/371
See application file for complete search history.

(56) References Cited

U.S. PATENT DOCUMENTS

| 7,425,740 | B2 | 9/2008 | Liu et al. |
| 8,048,723 | B2 | 11/2011 | Chang et al. |
| 8,053,299 | B2 | 11/2011 | Xu |
| 8,183,627 | B2 | 5/2012 | Currie |
| 8,415,718 | B2 | 4/2013 | Xu |
| 8,497,177 | B1 | 7/2013 | Chang et al. |
| 8,609,518 | B2 | 12/2013 | Wann et al. |
| 8,618,556 | B2 | 12/2013 | Wu et al. |
| 8,633,516 | B1 | 1/2014 | Wu et al. |
| 8,703,565 | B2 | 4/2014 | Chang et al. |
| 8,742,509 | B2 | 6/2014 | Lee et al. |

(Continued)

OTHER PUBLICATIONS

U.S. Appl. No. 15/348,652, filed Nov. 10, 2016.
U.S. Appl. No. 15/356,004, filed Nov. 18, 2016.

*Primary Examiner* — Tu-Tu Ho
(74) *Attorney, Agent, or Firm* — Birch, Stewart, Kolasch & Birch, LLP

(57) ABSTRACT

Semiconductor structures and methods for forming the same are provided. The method for forming a semiconductor structure includes forming an N-well region in a substrate and forming a first protection layer over the N-well region. The method for forming a semiconductor structure further includes forming a P-well region in the substrate and forming a second protection layer over the P-well region. The method for forming a semiconductor structure further includes growing a first channel layer over the first protection layer and a second channel layer over the second protection layer and forming a first gate structure over the first channel layer and a second gate structure over the second channel layer.

20 Claims, 11 Drawing Sheets

(56) References Cited

U.S. PATENT DOCUMENTS

| | | |
|---|---|---|
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2001/0045604 A1* | 11/2001 | Oda ................... B82Y 10/00 257/350 |
| 2002/0182811 A1* | 12/2002 | Moore ............. H01L 21/28202 438/287 |
| 2013/0285153 A1 | 10/2013 | Lee et al. |
| 2014/0183600 A1 | 7/2014 | Huang et al. |
| 2014/0252504 A1* | 9/2014 | Chuang ................ H01L 21/76 257/412 |
| 2014/0264590 A1 | 9/2014 | Yu et al. |
| 2014/0264592 A1 | 9/2014 | Oxland et al. |
| 2015/0263003 A1 | 9/2015 | Lee et al. |
| 2015/0349065 A1* | 12/2015 | Li ................... H01L 21/82381 257/369 |

\* cited by examiner

US 9,899,273 B1

SEMICONDUCTOR STRUCTURE WITH DOPANTS DIFFUSE PROTECTION AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher levels of integration of circuits. This is accomplished by miniaturizing or shrinking device sizes on a given chip. As device sizes shrink, tolerances play a more and more important role in the manufacturing process.

However, although existing semiconductor manufacturing processes have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
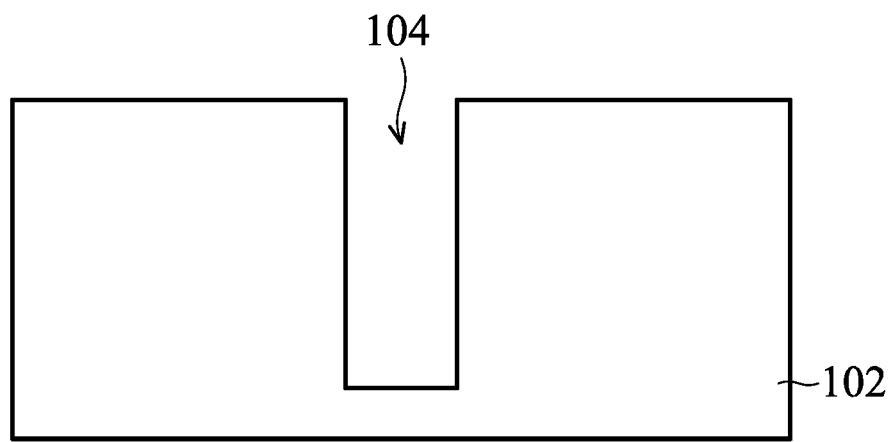
FIGS. 1A to 1K are cross-sectional representations of various stages of forming a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of semiconductor structures and methods for forming the same are provided. The semiconductor structure may include a substrate, and an N-well region and a P-well region formed in the substrate. A first protection layer and a second protection layer may be formed over the N-well region and the P-well region to prevent dopants in other units entering the N-well region and the P-well region.

FIGS. 1A to 1K are cross-sectional representations of various stages of forming a semiconductor structure 100a in accordance with some embodiments. First, a substrate 102 is received, and a trench 104 is formed in the substrate 102, as shown in FIG. 1A in accordance with some embodiments. In some embodiments, the substrate 102 is made of a semiconductor material. In some embodiments, the semiconductor material includes elementary semiconductor materials, compound semiconductor materials, and/or alloy semiconductor materials. In some embodiments, the semiconductor material includes Si (e.g. crystal silicon, polycrystalline silicon, or amorphous silicon), Ge, SiGe, SiC, SiCGe, SiP, SiB, SiGeB, SiCP, GaAs, GaP, InP, InAs, InGaAs, AlInGaAs, GaAsP, AlInAs, AlGaAs, GaInP, and/or GaInAsP. In some embodiments, the substrate 102 is a silicon substrate.

Figure 1B:
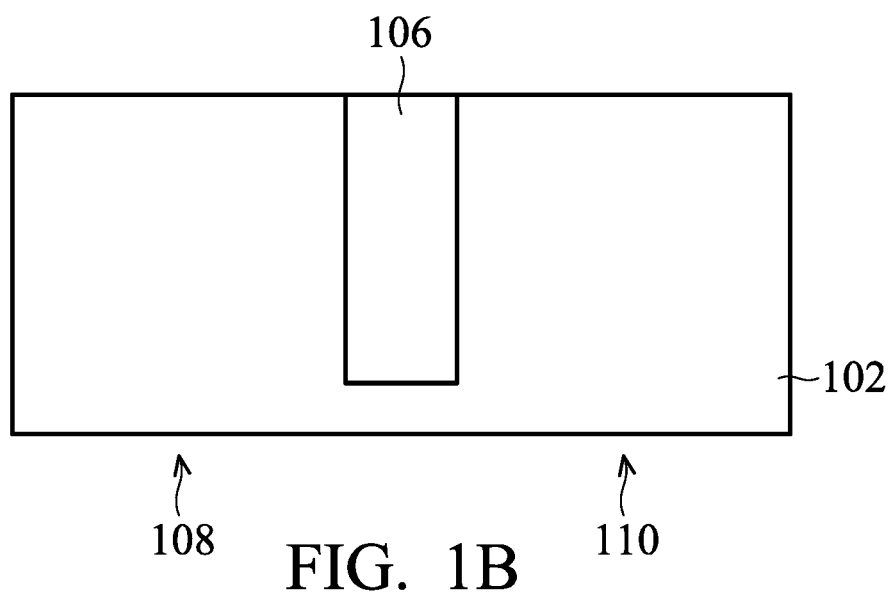

After the trench 104 is formed, an isolation structure 106 is formed in the trench 104, as shown in FIG. 1B in accordance with some embodiments. The isolation structure 106 may be formed by depositing an insulating material in the trench 104. In some embodiments, the isolation structure 106 is made of silicon oxide, silicon nitride, silicon oxynitride, fluoride-doped silicate glass (FSG), or other low-K dielectric materials.

Figure 1C:
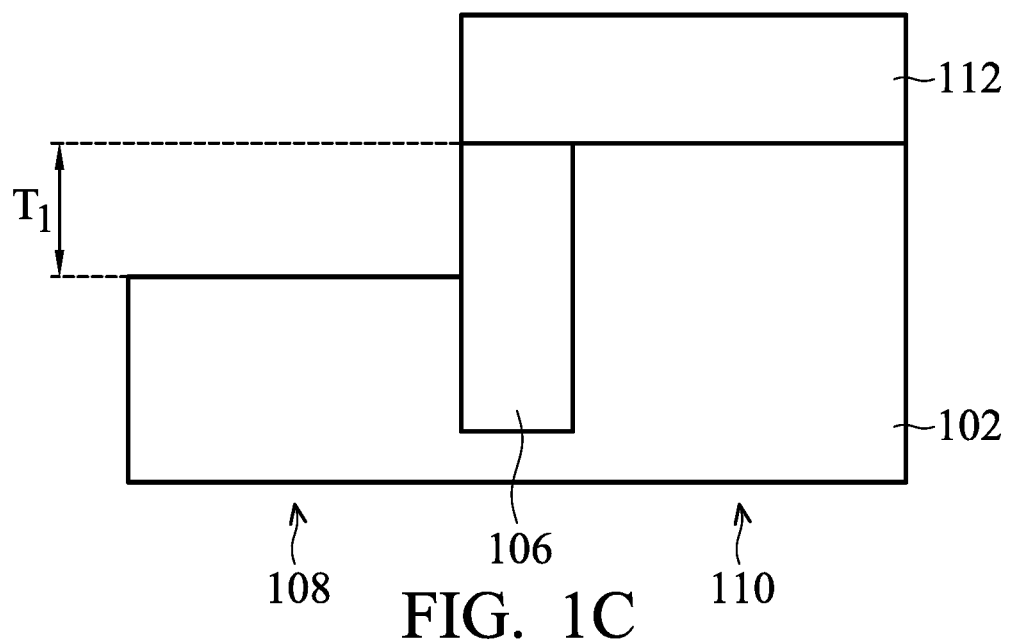

As shown in FIG. 1B, the isolation structure 106 divides the substrate 102 into a first side 108 and a second side 110 at the opposite sides of the isolation structure 106. After the isolation structure 106 is formed, the first side 108 of the substrate 102 is recessed, as shown in FIG. 1C in accordance with some embodiments. In some embodiments, the first side 108 of the substrate 102 is recessed by forming a hard mask structure 112 over the isolation structure 106 and the second side 110 of the substrate 102 and etching the first side 108 of the substrate 102. In some embodiments, the first side 108 of the substrate 102 is etched back for a first thickness $T_1$.

Figure 1D:
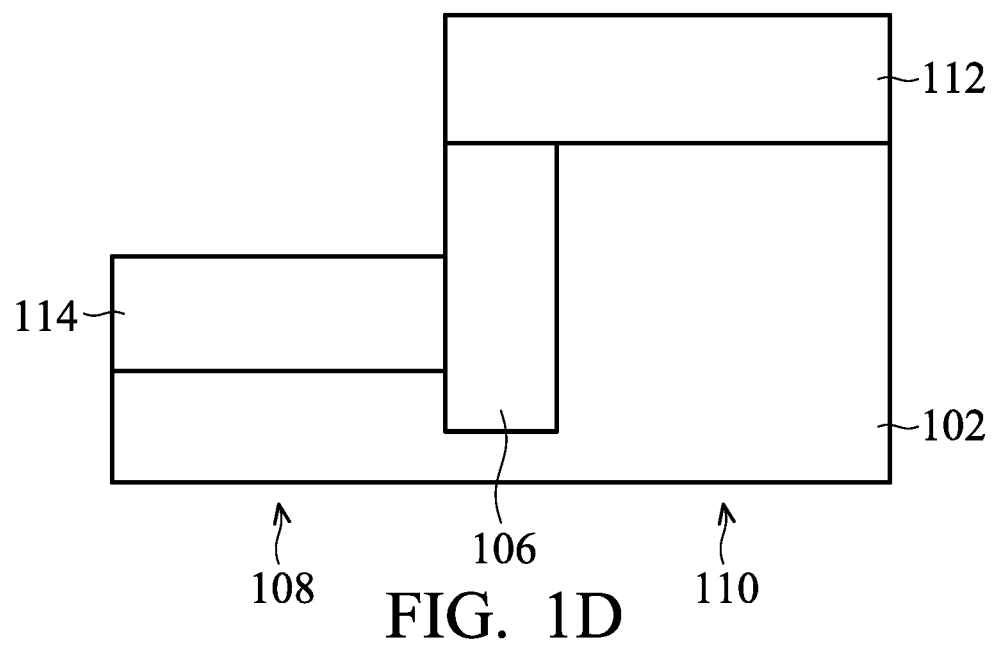

After the first side 108 of the substrate 102 is etched, an N-well region 114 is formed in the first side 108 of the substrate 102, as shown in FIG. 1D in accordance with some embodiments. In some embodiments, the N-well region 114 is formed by performing an implanting process. In some embodiments, the N-well region 114 is formed by doping N-type dopants in the first side 108 of the substrate 102. In some embodiments, the N-well region 114 is doped with arsenic (As) or phosphorous (P) ions.

Figure 1E:
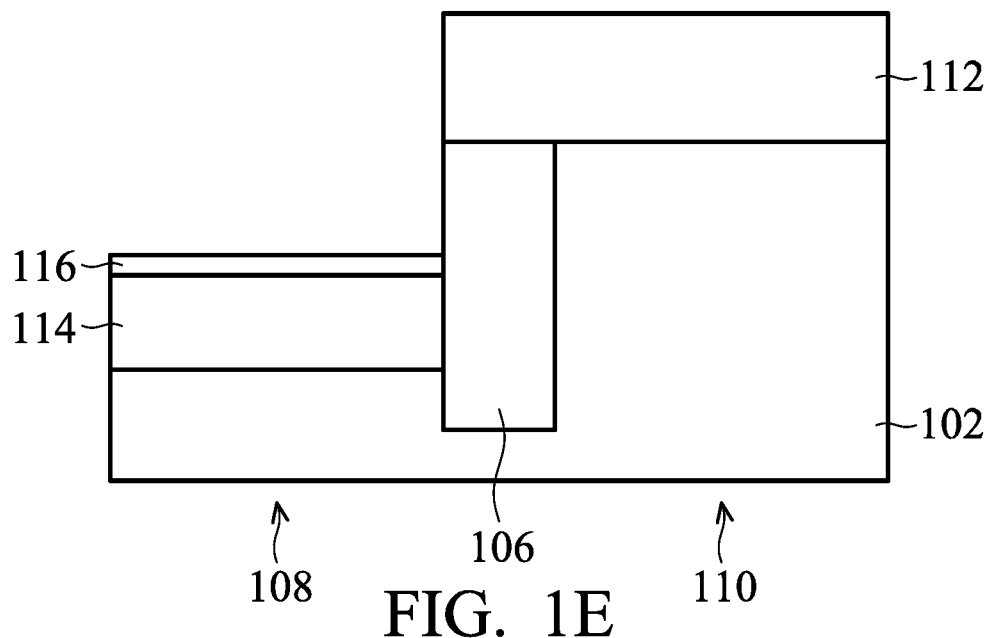

Next, a first protection layer 116 is formed on the N-well region 114, as shown in FIG. 1E in accordance with some embodiments. The first protection layer 116 is configured to prevent dopants in other regions (e.g. dopants in source/ drain structures formed afterwards) from entering the N-well region 114. In some embodiments, the thickness of the first protection layer 116 is in a range from about 5 nm to about 25 nm. The first protection layer 116 should be thick enough to provide sufficient protection for the N-well region 114. On the other hand, the first protection layer 116 should not be too thick or the parasitic capacitance may be too high.

In some embodiments, the first protection layer 116 is formed by performing an implanting process. In some embodiments, the first protection layer 116 is formed by doping dopants at the top portion of the first side 108 of the substrate 102. In some embodiments, the dopants include carbon and/or nitrogen. After the first protection layer 116 is formed, the hard mask structure 112 may be removed.

Figure 1F:
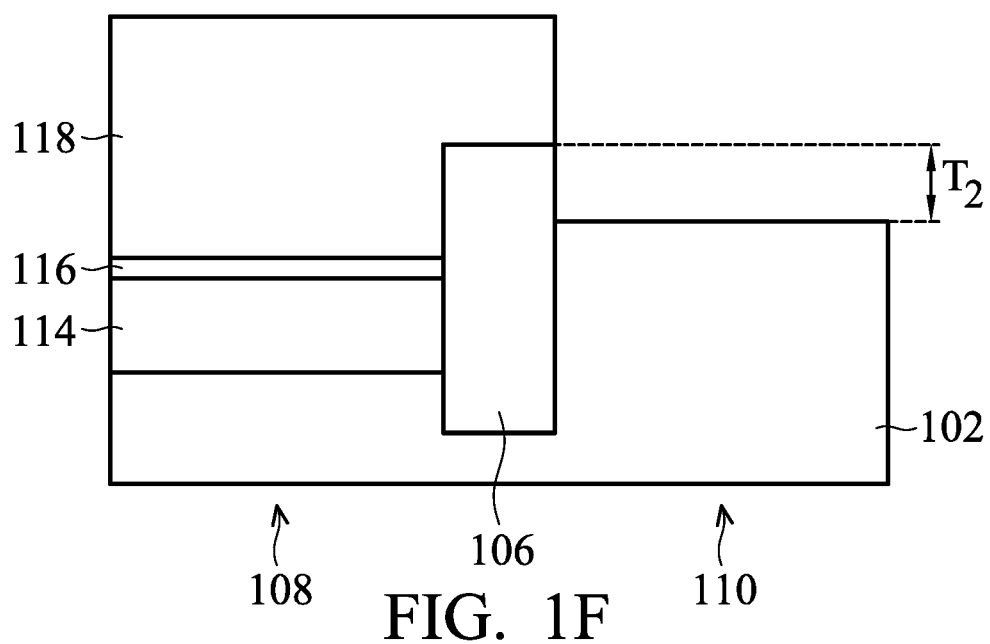

Next, the second side 110 of the substrate 102 is recessed, as shown in FIG. 1F in accordance with some embodiments. In some embodiments, the second side 110 of the substrate 102 is recessed by forming a hard mask structure 118 over the isolation structure 106 and the first side 108 of the substrate 102 and etching the second side 110 of the substrate 102. In some embodiments, the second side 118 of the substrate 102 is etched back for a second thickness $T_2$. In some embodiments, the first thickness $T_1$ is greater than the second thickness $T_2$. The thicknesses $T_1$ and $T_2$ may be adjusted according to the designed thicknesses of the channel layers which will be formed afterwards, so that dopant diffusion may be reduced. (Details will be described later.)

Figure 1G:
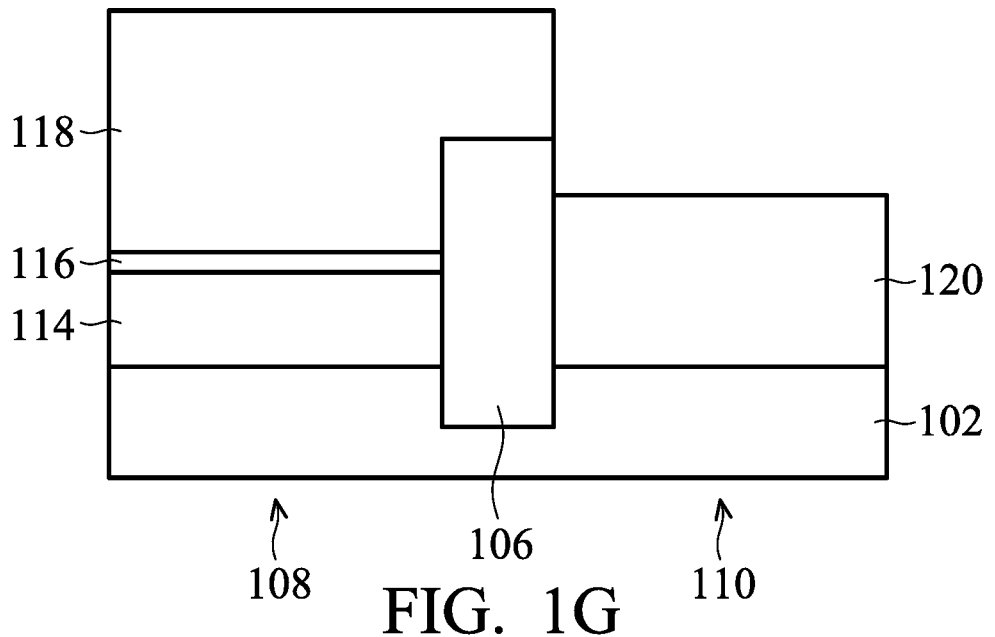

After the second side 110 of the substrate 102 is etched, a P-well region 120 is formed in the second side 110 of the substrate 102, as shown in FIG. 1G in accordance with some embodiments. In some embodiments, the P-well region 120 is formed by performing an implanting process. In some embodiments, the P-well region 120 is formed by doping P-type dopants in the second side 110 of the substrate 102. In some embodiments, the P-well region 120 is doped with boron (B) ions. In some embodiments, the thickness of the P-well region 120 is greater than the thickness of the N-well region 114.

Figure 1H:
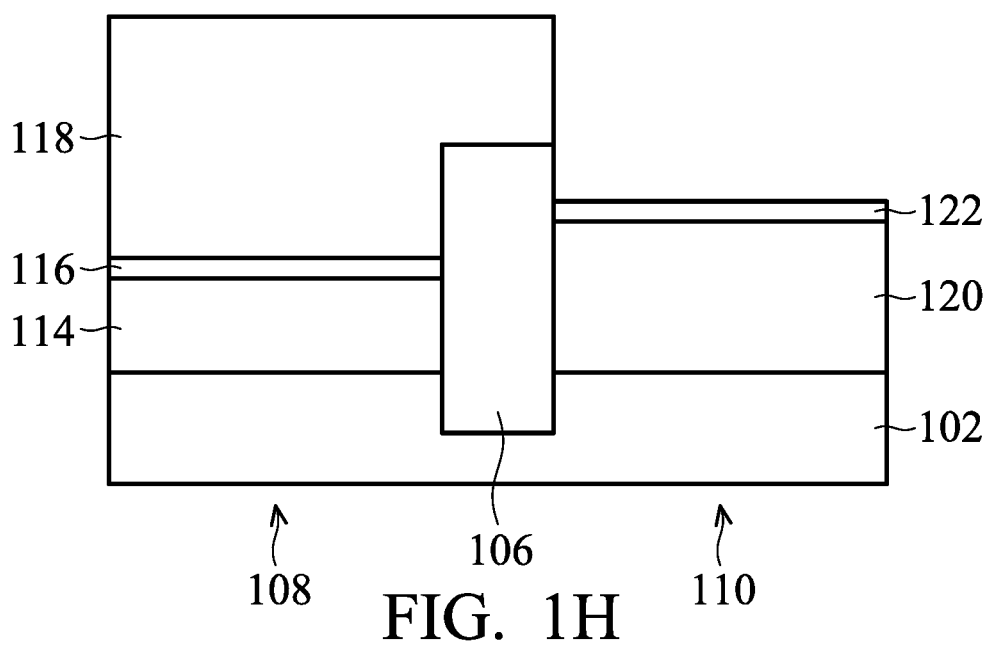

Next, a second protection layer 122 is formed on the P-well region 120, as shown in FIG. 1H in accordance with some embodiments. The second protection layer 122 is configured to prevent dopants in other regions (e.g. dopants in source/drain structures formed afterwards) from entering the P-well region 120. In some embodiments, the thickness of the second protection layer 122 is in a range from about 5 nm to about 25 nm. Similarly, the second protection layer 122 should be thick enough to provide sufficient protection for the P-well region 120. On the other hand, the second protection layer 122 should not be too thick or the parasitic capacitance may be too high.

In some embodiments, the second protection layer 122 is formed by performing an implanting process. In some embodiments, the second protection layer 122 is formed by doping dopants at the top portion of the second side 110 of the substrate 102. In some embodiments, the dopants include carbon and/or nitrogen.

In some embodiments, same dopants are used in the implanting processes which are used to form the first protection layer 116 and the second protection layer 122. In some embodiments, although the N-well region 114 and the P-well region 120 are doped with different types of dopants, the first protection layer 116 and the second protection layer 122 are doped with the same dopants, such as carbon and/or nitrogen. Since the first protection layer 116 and the second protection layer 122 are configured to protect the N-well region 114 and the P-well region 120 from dopants outside the regions, the conductive types of the dopants used in the first protection layer 116 and the second protection layer 122 does not need to be different even though they are formed over different types of wells. After the second protection layer 122 is formed, the hard mask structure 118 may be removed.

Figure 1I:
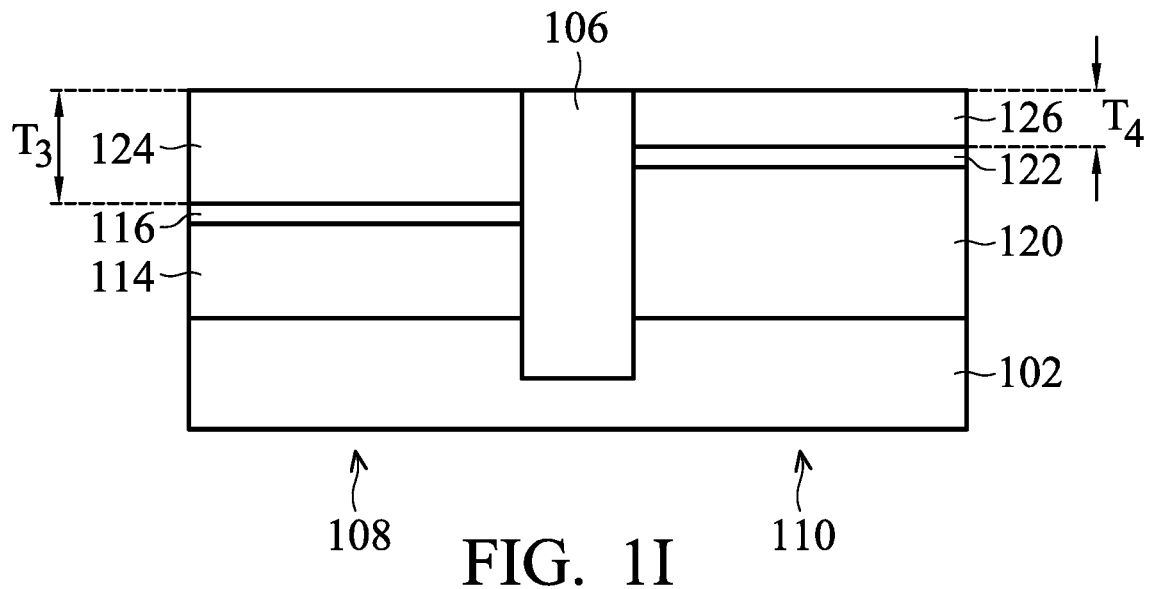

Next, a first channel layer 124 is formed over the first protection layer 116, and a second channel layer 126 is formed over the second protection layer 122, as shown in FIG. 1I in accordance with some embodiments. The thicknesses of the first channel layer 124 and the second channel layer 126 are controlled to prevent dopants in source/drain structures formed afterwards from diffusing into the N-well region 114 and the P-well region 120.

As shown in FIG. 1I, the first channel layer 124 formed over the N-well region 114 has a thickness $T_3$, and the second channel layer 126 formed over the P-well region 120 has a thickness $T_4$. In some embodiments, the thickness $T_3$ of the first channel layer 124 is greater than the thickness $T_4$ of the second channel layer 126. The thicknesses of the first channel layer 124 and the second channel layer 126 may be adjusted according to the designed thicknesses of source/drain structures formed afterwards, so that the dopant diffusion of the source/drain structures may be reduced.

In some embodiments, the thickness $T_3$ of the first channel layer 124 is in a range from about 40 nm to about 70 nm. The first channel layer 124 should be thick enough to provide sufficient space for the source/drain structure formed therein. On the other hand, the first channel layer 124 should not be too thick, or the size of the resulting device may become too large and the dopant diffusion may be increased.

In some embodiments, the thickness $T_4$ of the second channel layer 126 is in a range from about 30 nm to about 60 nm. Similarly, the second channel layer 126 should be thick enough to provide sufficient space for the source/drain structure formed therein afterwards. On the other hand, the second channel layer 126 should not be too thick, or the size of the resulting device may become too large and the dopant diffusion may be increased.

In some embodiments, the first channel layer 124 and the second channel layer 126 are formed by performing epitaxial growth processes to grow material layers over the first protection layer 116 and the second protection layer 122 and polishing the material layers afterwards. As described above, the first channel layer 124 is grown after the N-well region 114 and the first protection layer 116 are formed. Therefore, the dopants used to form the N-well region 114 and the first protection layer 116 in the implanting processes will be distributed (e.g. concentrated) in the N-well region 114 and the first protection layer 116. Accordingly, the first channel layer 124 formed afterwards can be free from these dopants. Similarly, the second channel layer 126 formed afterwards can be free from the dopants resulting from the formation of the P-well region 120 and the second protection layer 122.

In some embodiments, the first channel layer 124 and the second channel layer 126 are made of different materials. In some embodiments, the first channel layer 124 is made of silicon germanium (SiGe), and the second channel layer 126 is made of silicon (Si). Silicon germanium having a compressive strain may provide increased carrier speed and may be applied as the channel region in a PMOS device. On the other hand, silicon having an intrinsic tensile strain may be applied as the channel region in an NMOS device.

Figure 1J:
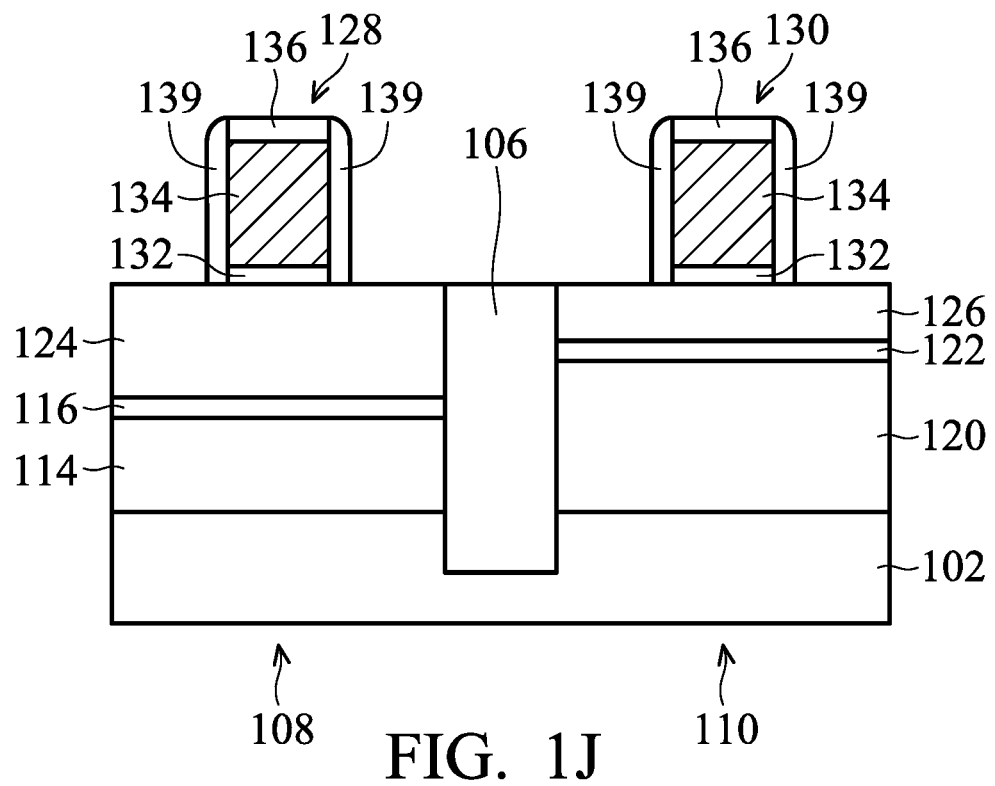

After the first channel layer 124 and the second channel layer 126 are formed, a first gate structure 128 is formed over the first channel layer 124 and a second gate structure 130 is formed over the second channel layer 126, as shown in FIG. 1J in accordance with some embodiments. In some embodiments, the first gate structure 128 and the second gate structure 130 individually include a gate dielectric layer 132, a gate electrode layer 134 formed over the gate dielectric layer 132, and a mask layer 136 formed over the gate electrode layer 134. In addition, spacers 139 are formed over the sidewalls of the first gate structure 128 and the second gate structure 130 in accordance with some embodiments.

In some embodiments, the gate dielectric layer 132 is made of high k dielectric materials, such as metal oxides, metal nitrides, metal silicates, transition metal oxides, transition metalnitrides, transition metalsilicates, oxynitrides of metals, or metal aluminates. Examples of the high k dielectric materials may include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide, or hafnium dioxide-alumina ($HfO_2$—$Al_2O_3$) alloy.

In some embodiments, the gate electrode layer 134 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials.

In some embodiments, mask layer 136 is made of silicon nitride, silicon oxide, silicon oxynitride, silicon carbide, or other applicable dielectric materials. In some embodiments, the spacers 139 are made of silicon nitride, silicon oxide, silicon oxynitride, silicon carbide, or other applicable dielectric materials.

Figure 1K:
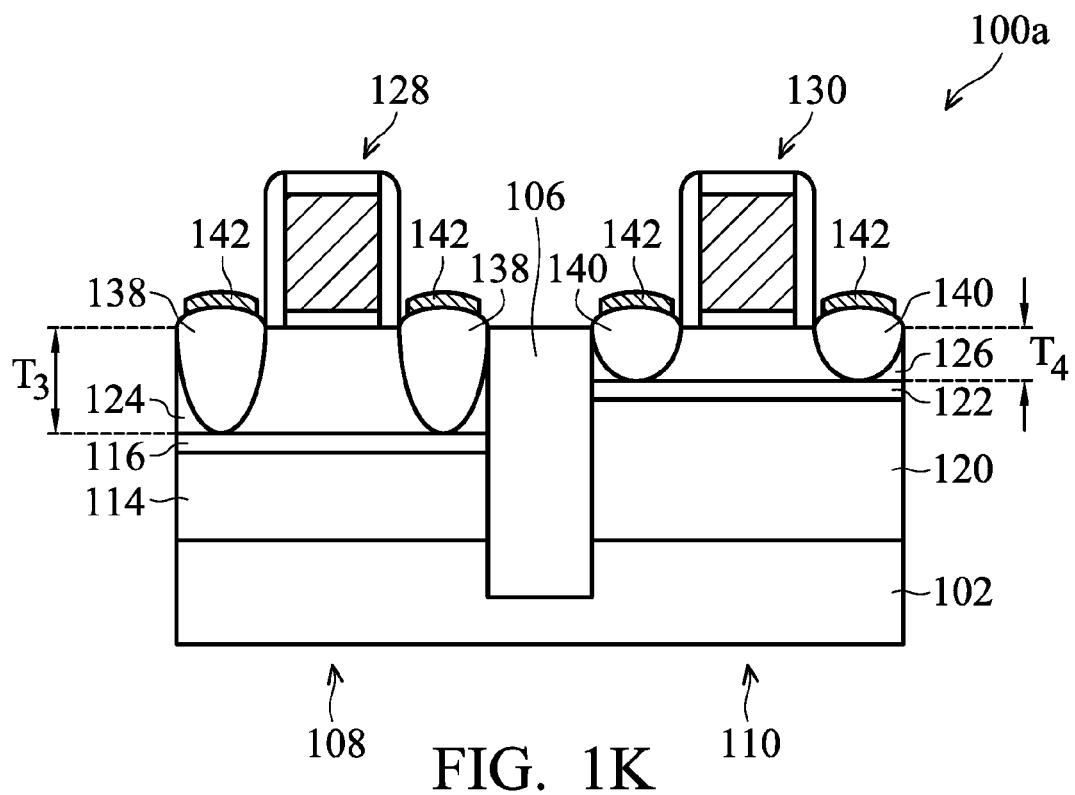

In addition, first source/drain structures 138 and second source/drain structure 140 are formed adjacent to the first gate structure 128 and the second gate structure 130, as shown in FIG. 1K in accordance with some embodiments. As shown in FIG. 1K, the first source/drain structures 138 are formed in the first channel layer 124, and the thickness of the first source/drain structure 138 is substantially equal to the thickness of the first channel layer 124 in accordance with some embodiments. In some embodiments, the first source/drain structures 138 are in contact with the first protection layer 116.

In addition, the second source/drain structures 140 are formed in the second channel layer 126, and the thickness of the second source/drain structure 140 is substantially equal to the thickness of the second channel layer 126 in accordance with some embodiments. In some embodiments, the second source/drain structures 140 are in contact with the second protection layer 122.

In some embodiments, the first source/drain structures 138 are thicker than the second source/drain structures 140. As described previously, the thicknesses of the first source/drain structures 138, the second source/drain structure 140, the first channel layer 124, and the second channel layer 126 are designed to prevent the dopants in the first source/drain structures 138 and the second source/drain structure 140 from diffusing into the N-well region 114 and the P-well region 120.

In some embodiments, the first source/drain structures 138 and the second source/drain structure 140 are formed by recessing the first channel layer 124 and the second channel layer 126 to form recesses in the first channel layer 124 and the second channel layer 126 respectively and forming strained materials in the recesses by performing epitaxial (epi) processes.

In some embodiments, the first source/drain structures 138 and the second source/drain structures 140 individually include silicon germanium (SiGe), germanium (Ge), indium arsenide (InAs), indium gallium arsenide (InGaAs), indium antimonide (InSb), gallium arsenide (GaAs), gallium antimonide (GaSb), indium aluminum phosphide (InAlP), indium phosphide (InP), or a combination thereof. In addition, an implantation processes may be performed to form the first source/drain structures 138 and the second source/drain structures 140.

After the first source/drain structures 138 and the second source/drain structures 140 are formed, silicide layers 142 are formed over the first source/drain structures 138 and the second source/drain structures 140, as shown in FIG. 1J in accordance with some embodiments. The silicide layer 142 may be formed by forming metal layers over the first source/drain structures 138 and the second source/drain structures 140, annealing the metal layers to react with the first source/drain structures 138 and the second source/drain structures 140, and removing the unreacted metal layers.

As shown in FIG. 1K, the semiconductor structure 100a includes the first channel layer 124 formed over the N-well region 114 and the second channel layer 126 formed over the P-well region 120, and the thickness $T_3$ of the first channel layer 124 is greater than the thickness $T_4$ of the second channel layer 122. It is found that the dopant diffusion of the second source/drain structures 140 may be reduced by forming the second channel layer 126 to be relatively thinner.

In addition, the first protection layer 116 and the second protection layer 122 formed over the N-well region 114 and the P-well region 120 may also prevent the dopants in the first source/drain structures 138 and the second source/drain structures 140 from diffusing into the N-well region 114 and the P-well region 120.

Furthermore, since the first channel layer 124 and the second channel layer 126 are grown after the N-well region 114, the first protection layer 116, the P-well region 120, and the second protection layer 122 are formed, the dopants used for forming the N-well region 114, the first protection layer 116, the P-well region 120, and the second protection layer 122 can be concentrated at their designed regions. That is, the first channel layer 124 and the second channel layer 126 will not have dopants doped therein during the implanting processes used for forming the N-well region 114, the first protection layer 116, the P-well region 120, and the second protection layer 122.

Figure 2:
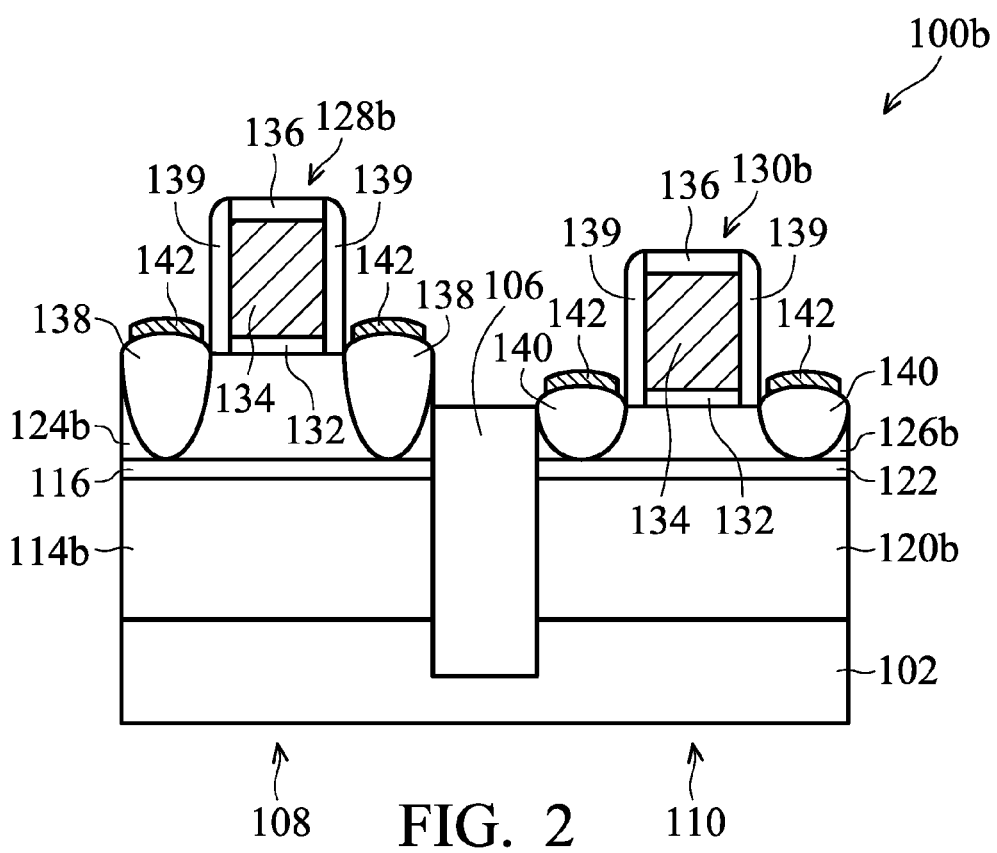
FIG. 2 is a cross-sectional representation of a semiconductor structure in accordance with some embodiments.

FIG. 2 is a cross-sectional representation of a semiconductor structure 100b in accordance with some embodiments. The semiconductor structure 100b is similar to, or the same as, the semiconductor structure 100a described previously, except the top surface of its first channel layer and its second channel layer are not level with each other. Some materials and processes used to form the semiconductor structure 100b may be similar to, or the same as, the semiconductor structure 100a described previously and are not repeated herein.

More specifically, the semiconductor structure 100b includes an N-well region 114b and a P-well region 120b formed at the opposite sides of the isolation structure 106 in the substrate 102, as shown in FIG. 2 in accordance with some embodiments. The N-well region 114b and the P-well region 120b may be similar to the N-well region 114 and the P-well region 120 described above but have similar thicknesses. After the N-well region 114b and the P-well region 120b are formed, the first protection layer 116 and the second protection layer 122 are formed over the N-well region 114b and the P-well region 120b to prevent dopants doped in other regions from diffusing into the N-well region 114b and the P-well region 120b.

After the first protection layer 116 and the second protection layer 122 are formed, the first channel layer 124b and the second channel layer 126b are formed over the first protection layer 116 and the second protection layer 122. Similar to the first channel layer 124 and the second channel layer 126, the first channel layer 124b is also thicker than the second channel layer 126b. In some embodiments, the top surface of the first channel layer 124b is higher than that of the second channel layer 126b. As described previously, the second channel layer 126b is relatively thinner and therefore the dopant diffusion may be reduced.

After the first channel layer 124b and the second channel layer 126b are formed, the first gate structure 128, the second gate structure 130, the spacers 129, the first source/drain structures 138, the second source/drain structures 140, and the silicide layers 142 are formed, as shown in FIG. 2 in accordance with some embodiments. As described previously, the semiconductor structure 100b includes the first channel layer 124b, the second channel layer 126b, the first protection layer 116, and the second protection layer 122, and therefore the performance of the semiconductor structure 100b may be improved.

FIGS. 3A to 3E are perspective representations of various stages of forming a semiconductor structure 100c in accordance with some embodiments. Some materials and processes used to form the semiconductor structure 100c may be similar to, or the same as, the semiconductor structures 100a and 100b described previously and are not repeated herein.

Figure 3A:
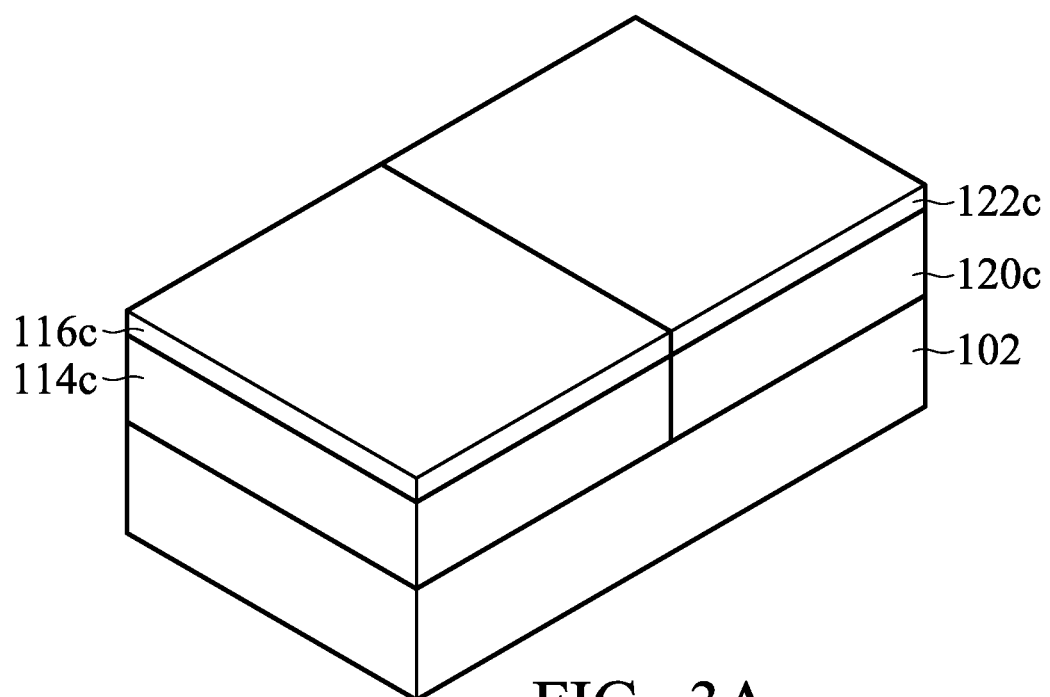
FIGS. 3A to 3E are perspective representations of various stages of forming a semiconductor structure in accordance with some embodiments.

Similar to semiconductor structure 100a described previously, an N-well region 114c and a P-well region 120c are formed in the substrate 102, as shown in FIG. 3A in accordance with some embodiments. In addition, a first protection layer 116c and a second protection layer 122c are formed over the N-well region 114c and the P-well region 122c. The material and processes used to form N-well region 114c, the P-well region 120c, the first protection layer 116c, and the second protection layer 122c may be similar to those used to form the N-well region 114, the P-well region 120, the first protection layer 116, and the second protection layer 122 described previously and are not repeated herein. As described previously, the formation of the first protection layer 116c and the second protection layer 122c may help prevent dopants diffusion during subsequent manufacturing processes.

Figure 3B:
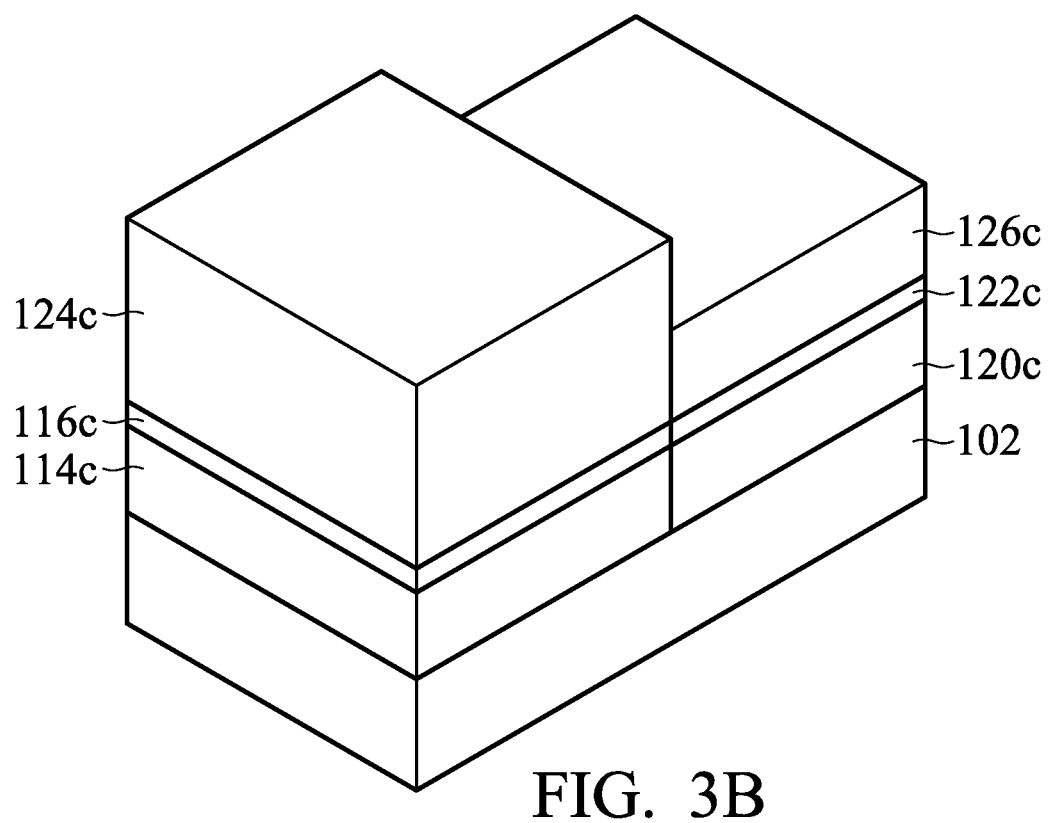

After the first protection layer 116c and the second protection layer 122c are formed, a first channel layer 124c and a second channel layer 126c are formed over the first protection layer 116c and the second protection layer 122c respectively, as shown in FIG. 3B in accordance with some embodiments. The materials and processes used to form the first channel layer 124c and the second channel layer 126c may be similar to those used to form the first channel layer 124 and the second channel layer 126 described previously and are not repeated herein.

As shown in FIG. 3B, the second channel layer 126c formed over the P-well region 120c is thinner than the first channel layer 124c formed over the N-well region 114c, and therefore the top surface of the second channel layer 126c is lower than the top surface of the first channel layer 124c in accordance with some embodiments. As described previously, the first channel layer 124c and the second channel layer 126c having different thicknesses may help reduce dopant diffusion during subsequent manufacturing processes.

Figure 3C:
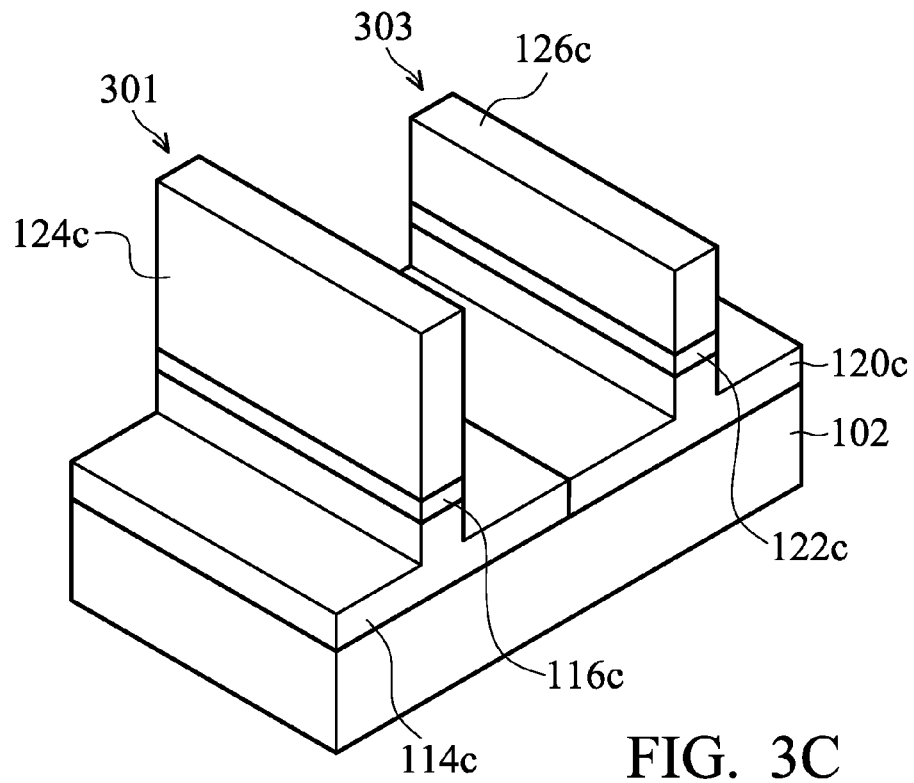

After the first channel layer 124c and the second channel layer 126c are formed, a first fin structure 301 and a second fin structure 303 are formed, as shown in FIG. 3C in accordance with some embodiments. More specifically, the first channel layer 124c, the first protection layer 116c, and the N-well region 114c of the substrate 102 are patterned to form the first fin structure 301, and the second channel layer 126c, the second protection layer 122c, and the P-well region 120c of the substrate 102 are patterned to form the second fin structure 303.

Figure 3D:
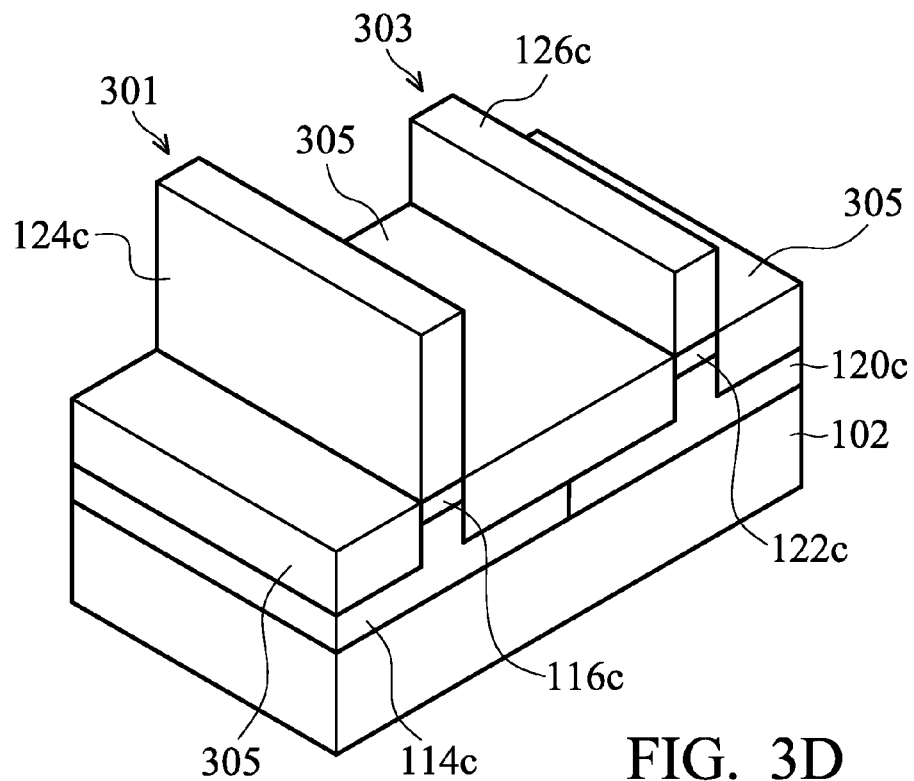

Afterwards, an isolation structure 305 is formed over the substrate 102, and the first fin structure 301 and the second fin structure 303 are surrounded by the isolation structure 305, as shown in FIG. 3D in accordance with some embodiments. The isolation structure 305 may be formed by depositing an insulating layer over the substrate 102 and recessing the insulating layer. In some embodiments, the isolation structure 305 is made of silicon oxide, silicon nitride, silicon oxynitride, fluoride-doped silicate glass (FSG), or other low-K dielectric materials.

Figure 3E:
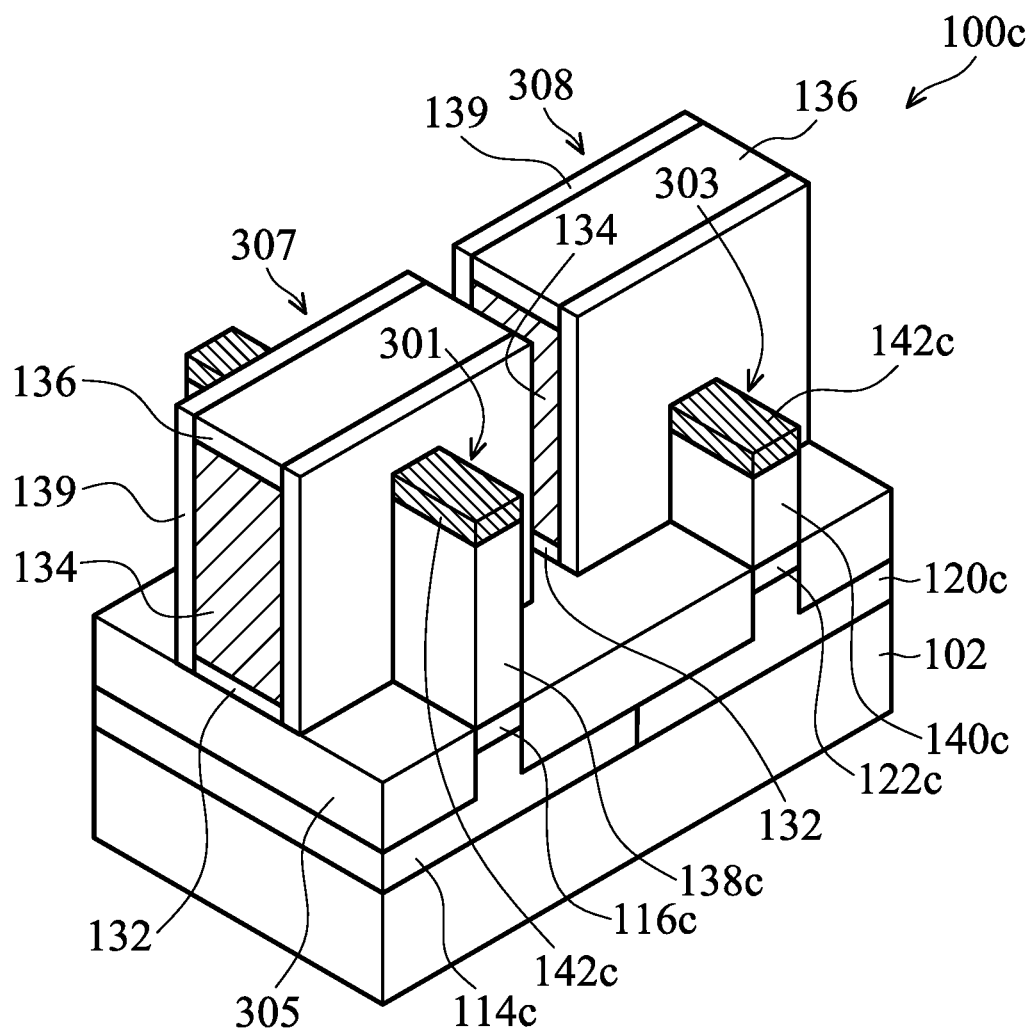

Next, a first gate structure 307 and a second gate structure 308 are formed across the first fin structure 301 and the second fin structure 303 respectively, as shown in FIG. 3E in accordance with some embodiments. As shown in FIG. 3E, the first gate structure 307 is formed over the first fin structure 301 and extends over the isolation structure 305, and the second gate structure 308 is formed over the second fin structure 303 and extends over the isolation structure 305. In some embodiments, the first gate structure 307 and the second gate structure 308 individually include the gate dielectric layer 132, the gate electrode layer 132 formed over the gate dielectric layer 132, and the mask layer 136 formed over the gate electrode layer 134. In addition, after the first gate structure 307 and the second gate structure 308 are formed, spacers 139 are formed on the sidewalls of the first gate structure 307 and the second gate structure 308 in accordance with some embodiments.

Next, first source/drain structures 138c and second source/drain structures 140c are formed in the first fin structure 301 and the second fin structure 303 respectively, as shown in FIG. 3E in accordance with some embodiments. In some embodiments, the first channel layer 124c of the first fin structure 301 adjacent to the first gate structure 307 are recessed to form recesses at two opposite sides of the first fin structure 301, and strained materials are grown in the recesses by an epitaxial (epi) process to form the first source/drain structures 138c. In some embodiments, the second channel layer 126c of the second fin structure 303 adjacent to the second gate structure 308 are recessed to form recesses at two opposite sides of the second fin structure 303, and strained materials are grown in the recesses by an epitaxial (epi) process to form the second source/drain structures 140c.

In some embodiments, the first source/drain structures 138c and the second source/drain structures 140c include Ge, SiGe, InAs, InGaAs, InSb, GaAs, GaSb, InAlP, InP, or the like. In addition, an implantation process may be performed to form the first source/drain structures 138c and the second source/drain structures 140c. In addition, silicide layers 142c similar to the silicide layer 142 are formed over the first source/drain structures 138c and the second source/drain structures 140c.

As described previously, the thicknesses of the first channel layer 116c and the second channel layer 140c are adjusted according to the devices they are applied to. By forming the second channel layer 140c having a relatively small thickness, dopant diffusion of the first source/drain structure 138c and the second source/drain structure 140c during subsequent manufacturing processes may be reduced.

In addition, the formation of the first protection layer 116c and the second protection layer 122c may also prevent dopant diffusion and the performance of the resulting semiconductor structure 100c may be improved.

Figure 4A:
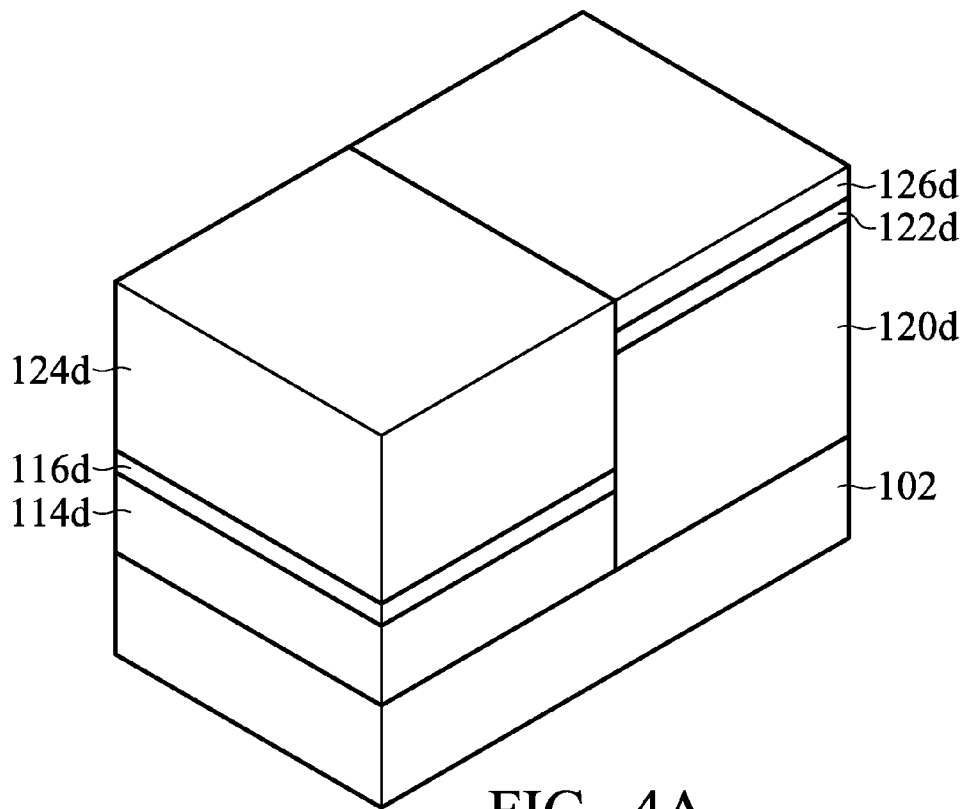
FIGS. 4A to 4C are perspective representations of various stages of forming a semiconductor structure in accordance with some embodiments.
Figure 4B:
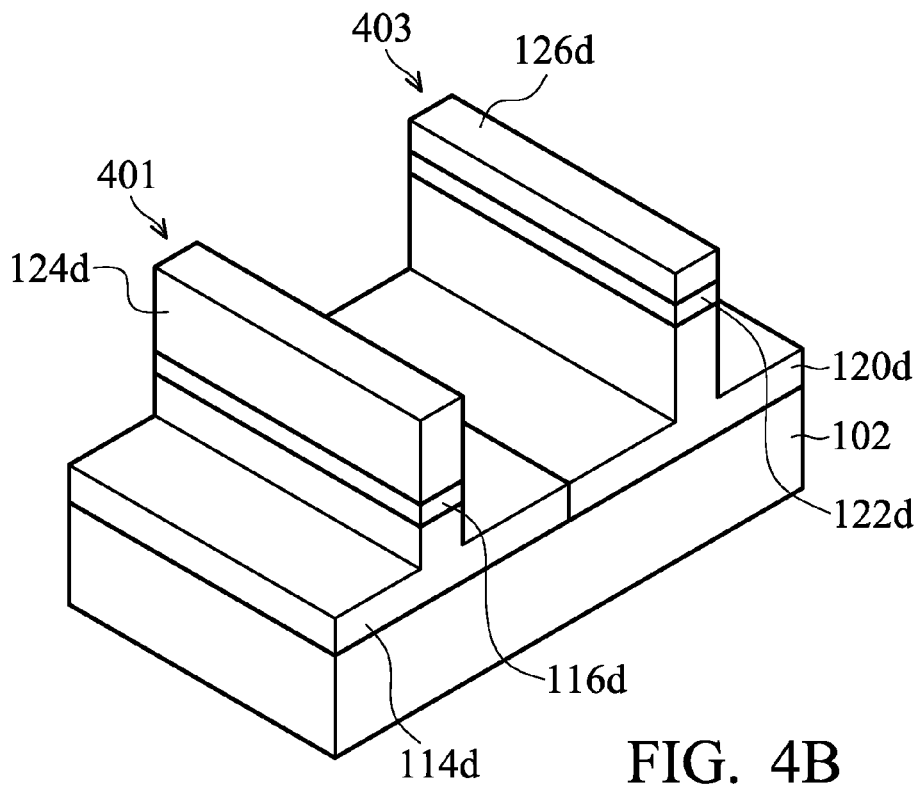
Figure 4C:
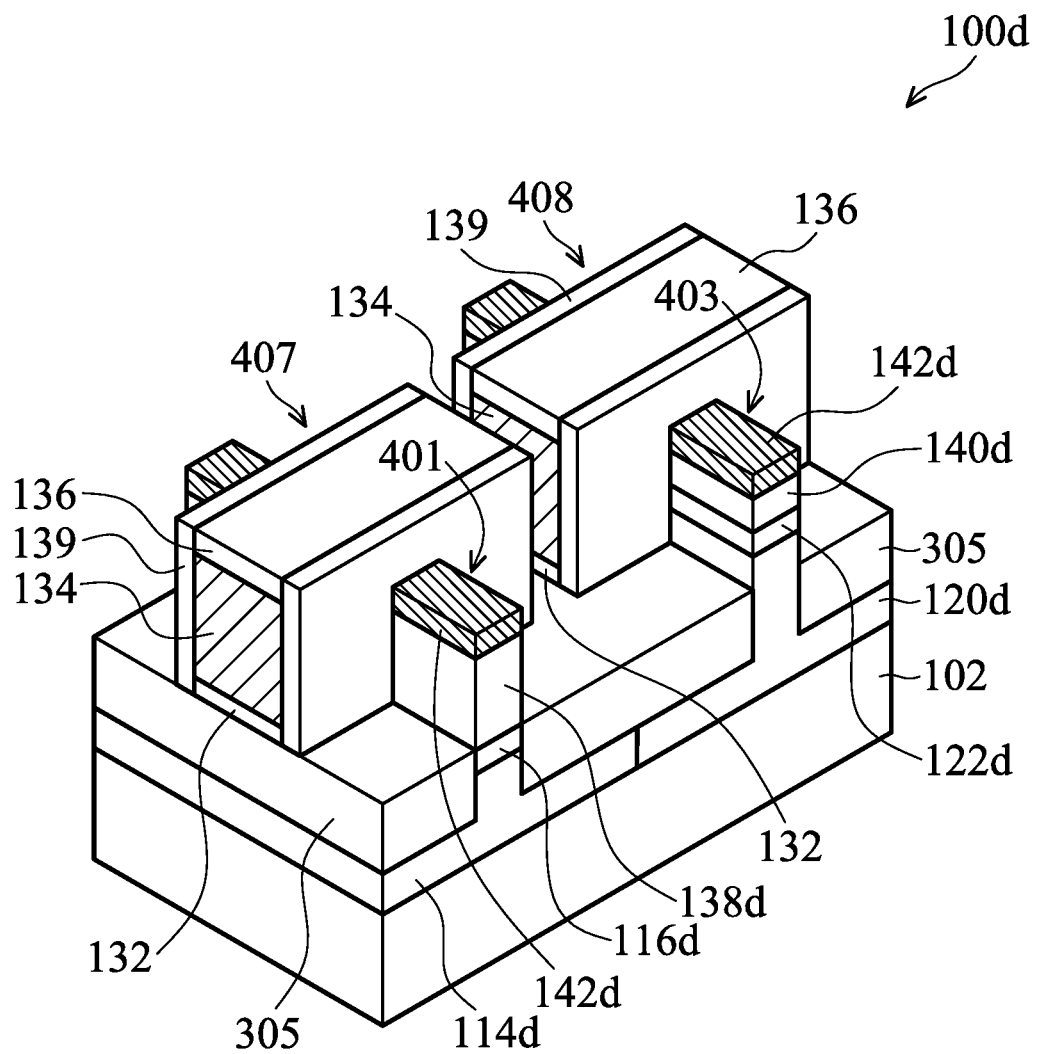

FIGS. 4A to 4C are perspective representations of various stages of forming a semiconductor structure 100d in accordance with some embodiments. The semiconductor structure 100d may be similar to, or the same as, the semiconductor structure 100c described previously, except the top surfaces of the first channel layer and the second channel layer in the semiconductor structure 100d are substantially level. Some materials and processes used to form the semiconductor structure 100d may be similar to, or the same as, the semiconductor structures 100a, 100b, and 100c described previously and are not repeated herein.

Similar to semiconductor structure 100c described previously, an N-well region 114d and a P-well region 120d are formed in the substrate 102, as shown in FIG. 4A in accordance with some embodiments. In addition, a first protection layer 116d and a second protection layer 122d are formed over the N-well region 114d and the P-well region 122d.

In some embodiments, the N-well region 114d has a thickness smaller than that of the P-well region 120d. In addition, the top surface of the P-well region 120d is higher than the top surface of the N-well region 114d in accordance with some embodiments. The materials and processes used to form N-well region 114d, the P-well region 120d, the first protection layer 116d, and the second protection layer 122d may be similar to those used to form the N-well region 114, the P-well region 120, the first protection layer 116, and the second protection layer 122 described previously and are not repeated herein. As described previously, the formation of the first protection layer 116d and the second protection layer 122d may help prevent dopants diffusion during subsequent manufacturing processes.

After the first protection layer 116d and the second protection layer 122d are formed, a first channel layer 124d and a second channel layer 126d are formed over the first protection layer 116d and the second protection layer 122d respectively, as shown in FIG. 4A in accordance with some embodiments. The material and processes used to form the first channel layer 124d and the second channel layer 126d may be similar to those used to form the first channel layer 124 and the second channel layer 126 described previously and are not repeated herein.

As shown in FIG. 4A, although the second channel layer 126d formed over the P-well region 120d is thinner than the first channel layer 124d formed over the N-well region 114d, the top surface of the second channel layer 126d is substantially level with the top surface of the first channel layer 124d in accordance with some embodiments. As described previously, the first channel layer 124d and the second channel layer 126d having different thicknesses may help reduce dopant diffusion during subsequent manufacturing processes.

After the first channel layer 124d and the second channel layer 126d are formed, a first fin structure 401 and a second fin structure 403 are formed, as shown in FIG. 4B in accordance with some embodiments. More specifically, the first channel layer 124d, the first protection layer 116d, and the N-well region 114d of the substrate 102 are patterned to form the first fin structure 401, and the second channel layer 126d, the second protection layer 122d, and the P-well region 120d of the substrate 102 are patterned to form the second fin structure 403.

Afterwards, the isolation structure 305 is formed over the substrate 102, and the first fin structure 401 and the second fin structure 403 are surrounded by the isolation structure 305, as shown in FIG. 4C in accordance with some embodiments. Next, a first gate structure 407 and a second gate structure 408 are formed across the first fin structure 401 and the second fin structure 403 respectively, as shown in FIG. 4C in accordance with some embodiments. In some embodiments, the first gate structure 407 and the second gate structure 408 individually include the gate dielectric layer 132, the gate electrode layer 132 formed over the gate dielectric layer 132, and the mask layer 136 formed over the gate electrode layer 134. In addition, after the first gate structure 407 and the second gate structure 408 are formed, spacers 139 are formed on the sidewalls of the first gate structure 307 and the second gate structure 308 in accordance with some embodiments.

Next, first source/drain structures 138d and second source/drain structures 140d are formed in the first fin structure 401 and the second fin structure 403 respectively, as shown in FIG. 4C in accordance with some embodiments.

As described previously, the thicknesses of the first channel layer 116d and the second channel layer 140d are adjusted so that dopant diffusion due to the manufacturing process performed afterwards may be reduced. In addition, the formation of the first protection layer 116d and the second protection layer 122d may also prevent dopant diffusion and the performance of the resulting semiconductor structure 100d may also be improved.

As described previously, implanting processes may be performed on the N-well region 114, 114b, 114c, and 114d and the P-well region 120, 120b, 120c, and 120d to form the first protection layer 116, 116b, 116c, and 116d and the second protection layer 122, 122b, 122c, and 122d over the N-well region 114, 114b, 114c, and 114d and the P-well region 120, 120b, 120c, and 120d in accordance with some embodiments. These protection layers may protect the N-well regions and the P-well regions from dopant diffusion of the dopants doped in other regions, so the resistances and the threshold voltages of the resulting semiconductor structures 100a to 100d may be reduced.

In addition, the first channel layer 124, 124b, 124c, and 124d and the second channel layer 126, 126b, 126c, and 126d are formed over the N-well region 114, 114b, 114c, and 114d and the P-well region 120, 120b, 120c, and 120d in accordance with some embodiments. The thicknesses of these channel layers are adjusted so that dopant diffusion may be suppressed. More specifically, the first source/drain structures 138, 138c, and 138d and the second source/drain structures 140, 140c, and 140d are formed in the first channel layer 124, 124b, 124c, and 124d and the second channel layer 126, 126b, 126c, and 126d. Since the second source/drain structures 140, 140c, and 140d are smaller and thinner than the first source/drain structures 138, 138c, and 138d, the second channel layer 126, 126b, 126c, and 126d, in which the second source/drain structures 140, 140c, and 140d are formed, can also be relatively thin. It is found that the resulting semiconductor structures 100a to 100d having relatively thin the second channel layer 126, 126b, 126c, and 126d formed over the P-well region 120, 120b, 120c, and 120d may have less dopant diffusion and the performance may be improved.

Furthermore, these channel layers are grown on the first protection layer 116, 116b, 116c, and 116d and the second protection layer 122, 122b, 122c, and 122d in accordance with some embodiments. That is, when the N-well region, the P-well region, the first protection layer, and the second protection layer are formed by performing implanting processes, the dopants will not enter the channel layers. Therefore, the dopants may be concentrated in the N-well region, the P-well region, the first protection layer, and the second protection layer as designed, and the performance of the resulting semiconductor structures may also be improved accordingly.

Embodiments for semiconductor structures and methods for forming the same are provided. The semiconductor structure may include a first protection layer formed over an N-well region, a first channel layer formed over the first protection layer, and a first source/drain structure formed in the first channel layer. In addition, the semiconductor structure may include a second protection layer formed over a P-well region, a second channel layer formed over the second protection layer, and a second source/drain structure formed in the second channel layer. The formation of the first protection layer and the second protection layer may help reduce dopants in the first source/drain structures and the second source/drain structures from diffusing into the N-well region and the P-well region. In addition, the second channel layer may be thinner than the first channel layer, so that the dopant diffusion may be further reduced. Accordingly, the performance of the resulting semiconductor structure may be improved.

In some embodiments, a method for forming a semiconductor structure is provided. The method for forming a semiconductor structure includes forming an N-well region in a substrate and forming a first protection layer over the N-well region. The method for forming a semiconductor structure further includes forming a P-well region in the substrate and forming a second protection layer over the P-well region. The method for forming a semiconductor structure further includes growing a first channel layer over the first protection layer and a second channel layer over the second protection layer and forming a first gate structure over the first channel layer and a second gate structure over the second channel layer.

In some embodiments, a method for forming a semiconductor structure is provided. The method for forming a semiconductor structure includes forming an N-well region in a substrate and doping first dopants in the substrate to form a first protection layer over the N-well region. The method for forming a semiconductor structure further includes forming a P-well region in the substrate adjacent to the N-well region and doping second dopants in the substrate to form a second protection layer over the P-well region. The method for forming a semiconductor structure further includes forming a first channel layer over the first protection layer and a second channel layer over the second protection layer and forming a first gate structure over the first channel layer and a second gate structure over the second channel layer.

In some embodiments, a semiconductor structure is provided. The semiconductor structure includes a substrate and an N-well region and a P-well region formed in the substrate. The semiconductor structure further includes a first protection layer formed over the N-well region and a second protection layer formed over the P-well region. The semiconductor structure further includes a first channel layer formed over the first protection layer and a second channel layer formed over the second protection layer. The semiconductor structure further includes a first gate structure formed over the first channel layer and a second gate structure formed over the second channel layer. In addition, the first channel layer is thicker than the second channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   forming an N-well region in a substrate;
   forming a first protection layer over the N-well region;
   forming a P-well region in the substrate;
   forming a second protection layer over the P-well region;
   growing a first channel layer over the first protection layer;
   growing a second channel layer over the second protection layer;
   forming a first gate structure over the first channel layer;
   forming a second gate structure over the second channel layer;
   forming a first source/drain structure in the first channel layer; and
   forming a second source/drain structure in the second channel layer,
   wherein the first source/drain structure has a thickness substantially equal to the thickness of the first channel layer, and the second source/drain structure has a thickness substantially equal to the thickness of the second channel layer.

2. The method for forming a semiconductor structure as claimed in claim 1, wherein the first protection layer and the second protection layer are formed by doping dopants in the substrate.

3. The method for forming a semiconductor structure as claimed in claim 2, wherein the dopants comprise carbon and/or nitrogen.

4. The method for forming a semiconductor structure as claimed in claim 1, wherein the first channel layer is formed by performing an epitaxial growth process.

5. The method for forming a semiconductor structure as claimed in claim 1, wherein the first channel layer has a thickness greater than that of the second channel layer.

6. The method for forming a semiconductor structure as claimed in claim 1, wherein a bottom surface of the first gate structure is higher than that of the second gate structure.

7. The method for forming a semiconductor structure as claimed in claim 1, wherein a top surface of the first channel layer is higher than a top surface of the second channel layer.

8. A method for forming a semiconductor structure, comprising:
   forming an N-well region in a substrate;
   forming a first protection layer over the N-well region by performing a first implanting process;
   forming a P-well region in the substrate;
   forming a second protection layer over the P-well region by performing a second implanting processes;
   forming a first channel layer over the first protection layer;
   forming a second channel layer over the second protection layer;

forming a first gate structure over the first channel layer;
forming a second gate structure over the second channel layer; and
forming a first source/drain structure in the first channel layer,
wherein a bottommost portion of the first source/drain structure is higher than a bottom surface of the first protection layer.

9. The method for forming a semiconductor structure as claimed in claim 8, wherein same dopants are used in the first implanting process and the second implanting process.

10. The method for forming a semiconductor structure as claimed in claim 8, wherein the first channel layer and the second channel layer are formed by performing epitaxial growth processes.

11. The method for forming a semiconductor structure as claimed in claim 10, wherein a thickness of the first channel layer is greater than a thickness of the second channel layer.

12. The method for forming a semiconductor structure as claimed in claim 10, further comprising:
forming a second source/drain structure in the second channel layer,
wherein the first source/drain structure is in contact with the first protection layer, and the second source/drain structure is in contact with the second protection layer.

13. The method for forming a semiconductor structure as claimed in claim 8, further comprising:
forming a second source/drain structure in the second channel layer,
wherein a bottommost portion of the second source/drain structure is higher than a bottom surface of the second protection layer, and the bottom surface of the second protection layer is higher than the bottommost portion of the first source/drain structure.

14. A semiconductor structure, comprising:
a substrate;
an N-well region and a P-well region formed in the substrate;
a first protection layer formed over the N-well region;
a second protection layer formed over the P-well region;
a first channel layer formed over the first protection layer;
a second channel layer formed over the second protection layer;
a first gate structure formed over the first channel layer; and
a second gate structure formed over the second channel layer,
wherein a thickness of the first channel layer is greater than a thickness of the second channel layer.

15. The semiconductor structure as claimed in claim 14, wherein the first protection layer and the second protection layer comprise the same dopants.

16. The semiconductor structure as claimed in claim 15, wherein the dopants comprises carbon and/or nitrogen.

17. The semiconductor structure as claimed in claim 14, further comprising:
a first source/drain structure formed in the first channel layer; and
a second source/drain structure formed in the second channel layer,
wherein a thickness of the first source/drain structure is substantially equal to the thickness of the first channel layer, and a thickness of the second source/drain structure is substantially the equal to the thickness of the second channel layer.

18. The semiconductor structure as claimed in claim 14, wherein a difference between the thickness of the first channel layer and the thickness of the second channel region is in a range from about 10 nm to about 30 nm.

19. The semiconductor structure as claimed in claim 14, wherein a top surface of the first channel layer is higher than a top surface of the second channel layer.

20. The semiconductor structure as claimed in claim 14, wherein a thickness of the first protection layer is in a range from about 5 nm to about 25 nm.

* * * * *